United States Patent
Argyres (10) Patent No.: US 9,123,417 B1
(45) Date of Patent: *Sep. 1, 2015

(54) CONTENT ADDRESSABLE MEMORY WITH BASE-THREE NUMERAL SYSTEM

(71) Applicant: NetLogic Microsystems, Inc., Irvine, CA (US)

(72) Inventor: Dimitri Argyres, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/106,237

(22) Filed: Dec. 13, 2013

Related U.S. Application Data (63) Continuation of application No. 13/215,887, filed on Aug. 23, 2011, now Pat. No. 8,638,582.

(51) Int. Cl.
*G11C 15/00* (2006.01)
*G11C 15/04* (2006.01)

(52) U.S. Cl.
CPC ..................... *G11C 15/04* (2013.01)

(58) Field of Classification Search
USPC .............. 365/49.1, 49.15, 49.16, 49.17
See application file for complete search history.

(56) References Cited

U.S. PATENT DOCUMENTS

| | | | | |
|---|---|---|---|---|
| 6,421,265 B1 * | 7/2002 | Lien et al. | ................ | 365/49.15 |
| 6,661,687 B1 * | 12/2003 | Lien et al. | ................ | 365/49.17 |
| 7,016,211 B2 * | 3/2006 | Park et al. | ................ | 365/49.12 |
| 7,149,845 B2 * | 12/2006 | Chan et al. | ................ | 711/108 |
| 7,269,040 B2 * | 9/2007 | Hu | ................ | 365/49.11 |
| 7,319,602 B1 * | 1/2008 | Srinivasan et al. | ........... | 365/49.1 |
| 7,852,652 B1 * | 12/2010 | Fabry | ................ | 365/49.17 |
| 8,059,439 B2 * | 11/2011 | Park | ................ | 365/49.1 |
| 8,619,451 B1 * | 12/2013 | Argyres | ................ | 365/49.17 |
| 8,638,582 B1 * | 1/2014 | Argyres | ................ | 365/49.1 |
| 8,730,704 B1 * | 5/2014 | Nataraj et al. | ........... | 365/49.17 |

* cited by examiner

*Primary Examiner* — Pho M Luu
(74) *Attorney, Agent, or Firm* — Sterne, Kessler, Goldstein & Fox P.L.L.C.

(57) ABSTRACT

A CAM cell is disclosed that can be selectively configured to store either base-2 data words or base-3 data words. When configured to store base-3 data words, the quaternary CAM cell compares 3 comparand bits representative of a base-3 comparand value with the base-3 data value stored in the CAM cell. Storing base-3 data words in such CAM cells increases the data storage density of associated CAM arrays.

19 Claims, 5 Drawing Sheets

| X | Y | Data value | |
|---|---|---|---|
| 0 | 0 | Don't' care | ~410 |
| 0 | 1 | 0 | ~412 |
| 1 | 0 | 1 | ~414 |
| 1 | 1 | 2 | ~416 |

| C1 | C2 | C3 | Function | |
|---|---|---|---|---|
| 0 | 0 | 0 | Precharge | ~460 |
| 0 | 0 | 1 | Search 2 | ~461 |
| 0 | 1 | 0 | Search 1 | ~462 |
| 0 | 1 | 1 | Invalid | ~463 |
| 1 | 0 | 0 | Search 0 | ~464 |
| 1 | 0 | 1 | Invalid | ~465 |
| 1 | 1 | 0 | Invalid | ~466 |
| 1 | 1 | 1 | Invalid | ~467 |

CONTENT ADDRESSABLE MEMORY WITH BASE-THREE NUMERAL SYSTEM

CROSS-REFERENCE TO RELATED APPLICATIONS

This nonprovisional application is a continuation of application Ser. No. 13/215,887, now U.S. Pat. No. 8,638,582, titled "Content Addressable Memory With Base-Three Numeral System," and filed 23 Aug. 2011, the entirety of which is hereby incorporated by reference.

TECHNICAL FIELD

The present embodiments generally relate to content addressable: memory (CAM) devices, and more particularly to CAM devices having cells which may employ a base-3 numeral system to store a base-3 digit ("trit") of a data word.

BACKGROUND

Content addressable memory (CAM) devices are frequently used in network switching and routing applications to determine forwarding destinations for data packets. A CAM device can be instructed to compare a selected portion of an incoming packet (e.g., a destination address extracted from the packet header) with CAM words (e.g., forwarding addresses) stored in an array within the CAM device. If there is a matching entry stored in the CAM array, the index of the matching CAM word can be used to access a corresponding location in an associated memory device to retrieve a destination address and/or other routing information for the packet.

A CAM device includes a CAM array having a plurality of CAM cells organized in a number of rows and columns. Each row of CAM cells, which can be used to store a CAM word, is coupled to a corresponding match line that indicates match results for the row. Each column of CAM cells is typically coupled to one or more data lines or data line pairs that can be used to drive data into a selected CAM row during write operations, read data from a selected CAM row during read operations, and/or for providing a search key to the CAM rows during compare operations. During a compare operation, the search key (e.g., the comparand word) is provided to the CAM array and compared with the CAM words stored therein. For each CAM word that matches the search key, a corresponding match line is asserted to indicate the match result. If any of the match lines are asserted, a match flag is asserted to indicate the match condition, and a priority encoder determines the match address or index of the highest priority matching entry in the CAM array.

CAM arrays typically include either binary CAM cells that store binary data values (i.e., a logic "1" or a logic "0" value) or ternary CAM cells that store ternary data values (i.e., a logic "1" value, a logic "0" value, or a don't care value). Ternary CAM cells store a data bit and a mask bit. For example, when a mask bit within a ternary CAM cell is inactive (e.g., set to a logic 1 value), the ternary CAM cell operates as a conventional binary CAM cell storing an "unmasked" data bit. Men the mask hit is active (e.g., set to a logic 0 value), the ternary CAM cell stores a "don't care" value, which means that all compare Operations performed on the actively masked ternary CAM cell will result in a cell match condition.

Figure 1A:
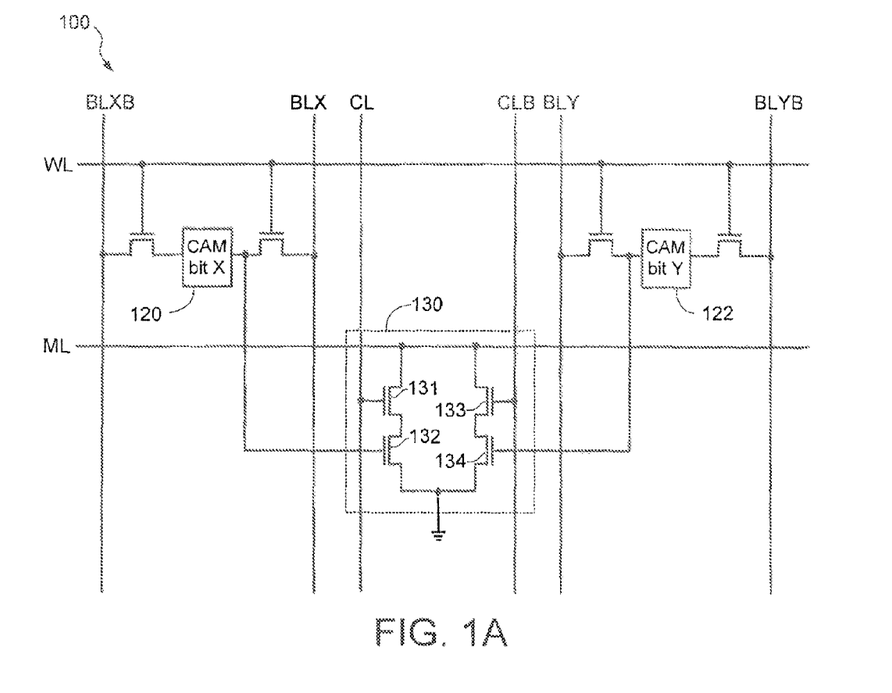
FIG. 1A is circuit diagram of a conventional quaternary (XY) CAM cell.
Figure 1B:
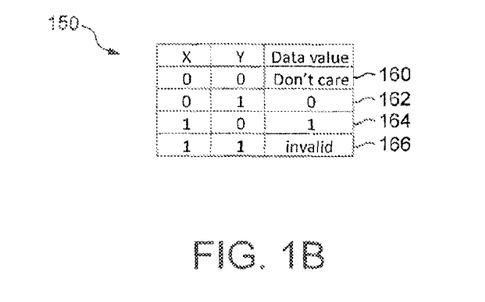
FIG. 1B shows a truth table for conventional data storage of the XY CAM cell of FIG. 1A.

FIG. 1A shows a well-known quaternary CAM cell 100. Quaternary CAM cell 100, which is also referred to as an XY CAM cell, includes two storage cells 120 and 122 coupled to a compare circuit 130. The two data bits X and Y can collectively represent four possible states: "0", "1", "don't care", and a fourth state which may be left unused or may indicate "invalid," as depicted in FIG. 1B. The logic "0" and "1" states correspond to the logic states represented, for example, by a conventional binary CAM cell. For each of these states, if the comparand data (e.g., provided to CAM cell 100 via complementary comparand lines CL and CLB) matches the data stored in CAM cell 100, compare circuit 130 does not discharge the match line ML, which indicates a match condition. Conversely, if the comparand data does not match the data stored in CAM cell 100, compare circuit 130 discharges ML (e.g., toward ground potential) to indicate the mismatch condition. For the "don't care" state, the logic low values for X and Y maintain respective transistors 132 and 134 in non-conductive states, thereby preventing compare circuit 130 from discharging ML. In this manner, data stored in CAM cell 100 is masked from the compare operation, thereby forcing a match condition for CAM cell 100, regardless of the comparand data. For the "invalid" state, the logic high values for X and Y maintain respective transistors 132 and 134 in conductive states. During a compare operation, one of the complementary comparand data bit pair provided on CL/CLB will be logic high, thereby causing compare circuit 130 to discharge ML to indicate the mismatch state. In this manner, data stored in CAM cell 100 forces a mismatch condition, regardless of the comparand data, and is therefore not normally used.

Note that the XY CAM cell 100 stores a data value as a complimentary bit pair, where the Y bit stores the binary value and the X bit stores the complemented binary value. However, because only three of the four possible states represented by XY CAM cell 100 are used, data storage capacity is not fully utilized. Thus, it would be desirable to utilize all four of the possible quaternary states to maximize data storage density.

BRIEF DESCRIPTION OF TH DRAWINGS

Present embodiments are illustrated by way of example, and not by way of limitation, in the figures of the accompanying drawings and in which like reference numerals refer to similar elements and in which.

DETAILED DESCRIPTION

A quaternary CAM cell is disclosed that allows storage of a base-3 digit (or "trit") of a base-3 data word. By storing base-3 data values according to present embodiments, data storage density of CAM devices can be increased and power consumption can be reduced (e.g., as compared to storing conventional binary and ternary data). In the following description, numerous specific details are set forth in order to provide a thorough understanding of the present embodiments. It will be apparent, however, that the present embodiments may be practiced without these specific details. In other instances, well-known structures and devices are shown in block diagram form to avoid unnecessarily obscuring the exemplary embodiments described herein.

More specifically, present embodiments employ a data storing technique that allows an array of XY CAM cells to store larger amounts of information by utilizing all four possible states of the XY CAM cells. For some embodiments, the XY CAM cells are each configured to store a single trit of a base-3 data word. For some embodiments, the CAM device is configured to receive a 3-bit binary comparand to compare a base-3 data word within each XY CAM.

For example, a CAM row including 4 XY CAM cells configured in accordance with present embodiments can store 4 base-3 data values, representing a maximum of $3^4=81$ different values, as explained in detail below. In contrast, for conventional approaches in which each XY CAM cell stores a single data bit, at least Ceiling($\log_2 81$)=7 CAM cells are required to store the same amount of information (e.g., 81 possible states). Thus, for this example, storing base-3 data values in the CAM cells results in up to a 406% increase in data storage capacity (i.e., $3^4$ versus $2^4$). Further, for this example, power consumption attributed to the comparand lines is reduced by approximately 14% because compare data is switched on only 12 comparand lines instead of on 14 comparand lines. In addition, power consumption attributed to the match lines is also reduced by approximately the same amount because there are only 12 pull-down transistors coupled to the match line instead of 14 pull-down transistors.

Figure 2:
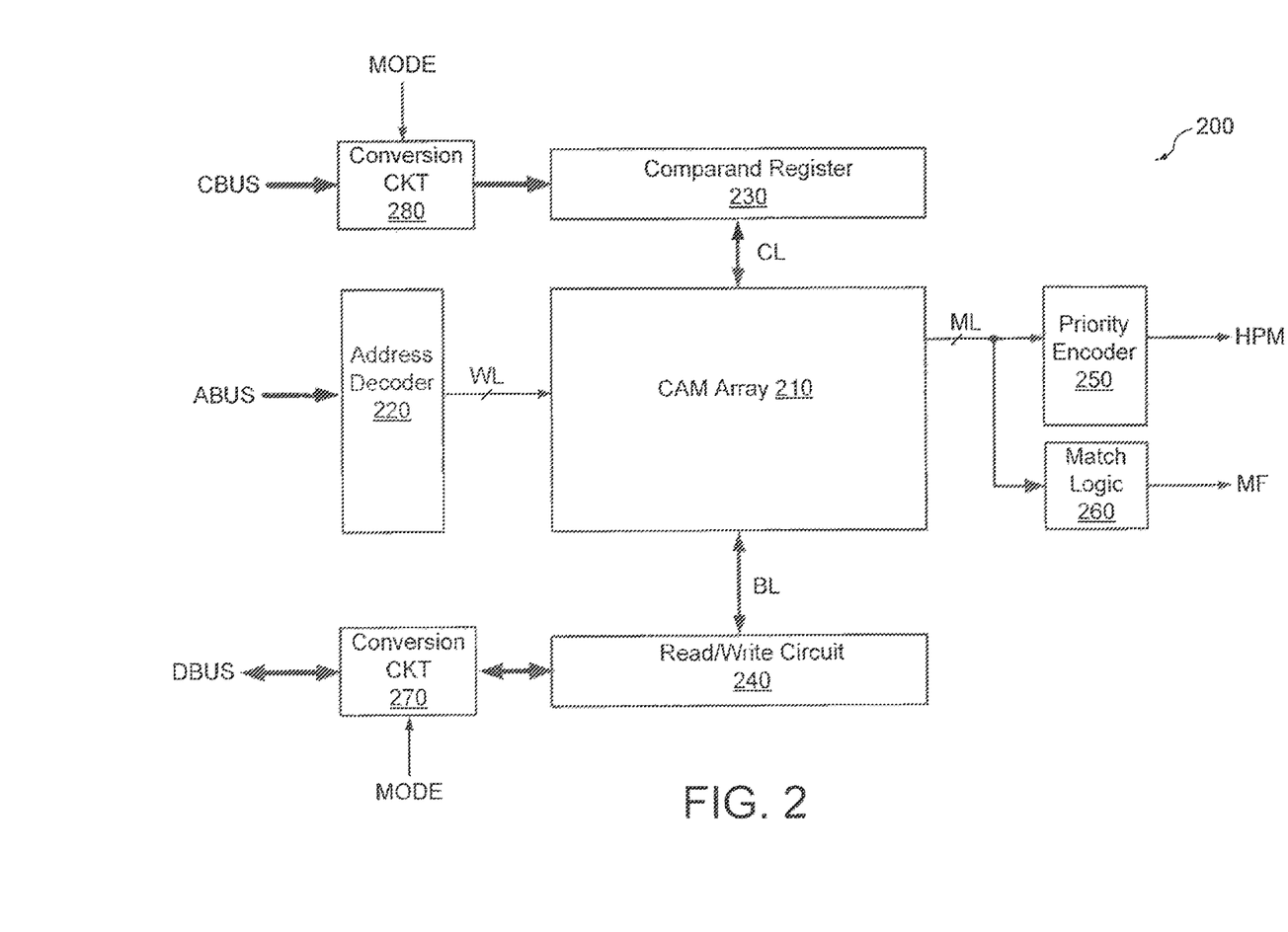
FIG. 2 is a block diagram of a CAM device within which the present embodiments may be implemented.

FIG. 2 is a block diagram of a CAM device 200 within which the present embodiments may be implemented. CAM device 200 includes a CAM array 210, an address decoder 220, a comparand register 230, a read/write circuit 240, a priority encoder circuit 250, match logic 260, a data conversion circuit 270, and a comparand conversion circuit 280. CAM array 210 includes any number of rows of CAM cells (not shown for simplicity in FIG. 2), where each row of CAM cells can be configured to store a data word. Further, while CAM array 210 is shown in FIG. 2 as a single CAM array, it may include any number of CAM array blocks that can be independently searched. One or more instructions and related control signals may be provided to CAM device 200 from an instruction decoder (not shown for simplicity) to control read, write, compare, and other operations for CAM device 200. Other well-known signals that can be provided to CAM device 200, such as enable signals, clock signals, and power connections, are not shown for simplicity. Further, although not shown in FIG. 2, each row of CAM cells in CAM array 210 may have one or more validity bits to indicate whether the corresponding row (or any segment thereof) of CAM cells stores valid data.

Each row of CAM cells (not shown in FIG. 2 for simplicity) in CAM array 210 is coupled to address decoder 220 via a corresponding word line WL, and to priority encoder 250 and well-known match logic 260 via a corresponding match line ML. For simplicity, the word lines and match lines are represented collectively in FIG. 2. Address decoder 220 is well-known, and includes circuitry to select corresponding rows in CAM array 210 for read, write, and/or other operations in response to an address received from an address bus (ABUS) using the word lines WL. For other embodiments, addresses may be provided to address decoder 220 from another suitable bus and/or circuitry.

The match lines ML provide match results for compare operations between comparand data (e.g., a search key) and data stored in CAM array 210. Priority encoder 250, which is well-known, uses the match results indicated on the match lines to determine the matching entry that has the highest priority number associated with it and generates the index or address of this highest priority match (HPM). In addition, priority encoder 250 may use the validity bits from CAM array 210 to generate the next free address that is available in CAM array 210 for storing new data. Although not shown in FIG. 2, for some embodiments, priority encoder 250 may provide the next free address to the address decoder 220.

Match logic 260, which is well-known, uses the match results indicated on the match lines to generate a match flag (MF) indicative of a match condition in CAM array 210. If there is more than one matching entry in CAM array 210, match logic 260 may generate a multiple match flag to indicate a multiple match condition. In addition, match logic 260 may use the validity bits from CAM array 210 to assert a full flag when all of the rows of CAM cells in CAM array 210 are filled with valid entries.

Each column of CAM cells (not shown in FIG. 2 for simplicity) in CAM array 210 is coupled to comparand register 230 via one or more corresponding comparand lines CL, and is coupled to read/write circuit 240 via one or more corresponding bit lines BL. For some embodiments, each column of CAM cells is coupled to comparand register 230 via three comparand lines that provide a corresponding trit of the comparand word to the associated column of CAM cells. For simplicity, the comparand lines CL and bit lines BL are represented collectively in FIG. 2. Comparand register 230 is well-known, and is configured to provide a search key (e.g., a comparand word) to CAM array 210 during compare operations with data stored therein. For the exemplary embodiment shown in FIG. 2, the comparand conversion circuit 280 has an input to receive a base-2 comparand value from the comparand bus (CBUS), a control terminal to receive a mode select signal (MODE), and an output coupled to an input of comparand register 230. In response to the MODE signal, the comparand conversion circuit 280 selectively converts the base-2 comparand word into a base-3 comparand word, which in turn is provided to the CAM array 210 via comparand register 230. The comparand conversion circuit 280 can be implemented using any suitable logic circuit, for example that operates according to the truth table 450 of FIG. 4B. For other embodiments, the search key can be provided to CAM array 210 via another bus and/or circuit.

Read/write circuit 240 includes well-known write drivers to write data received from a data bus (DBUS) to CAM array 210 via the bit lines BL, and includes well-known sense amplifiers to read data from CAM array 210 onto DBUS. For the exemplary embodiment shown in FIG. 2, the data conversion circuit 270 has an input to receive a base-2 data value from data bus (DBUS), a control terminal to receive the mode select signal (MODE), and an output coupled to an input of read/write circuit 240. In response to the MODE signal, the data conversion circuit 270 selectively converts the base-2 data word into a base-3 data word, which in turn is provided to the CAM array 210 for storage therein via read/write circuit 240 during write operations. In addition, the data conversion circuit 270 can selectively (e.g., in response to MODE) convert a base-3 data word read from CAM array 210 into a base-2 data word for output onto DBUS during read operations. The data conversion circuit 270 can be implemented using any suitable logic circuit, for example that operates according to the truth table 450 of FIG. 4B. For other embodiments, read/write circuit 240 may be coupled to a bus other than DBUS. Further, although not shown in FIG. 2 for simplicity, CAM device 200 can include a well-known global mask circuit (e.g., coupled to the comparand register 230) that can selectively mask the bits of the search key provided to the CAM array 210.

Figure 3:
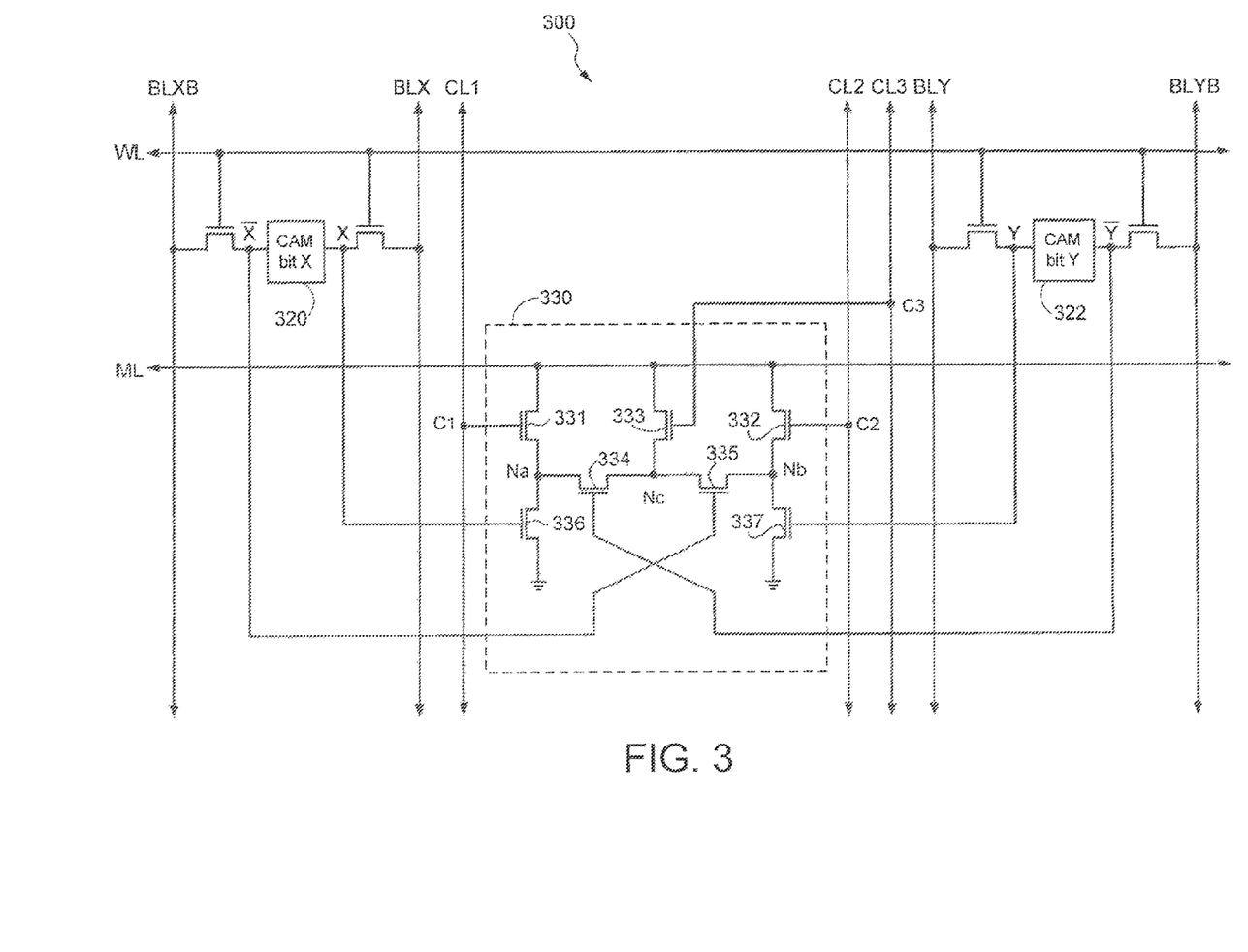
FIG. 3 is a circuit diagram of a quaternary CAM coil according to one embodiment.

FIG. 3 is a circuit diagram of a base-3 XY CAM cell 300 in accordance with present embodiments. The CAM cell 300 includes two memory cells 320 and 322 coupled to a compare circuit 330. The memory cells 320 and 322 can be any suitable type of storage cell including, for example, an SRAM cell, a DRAM cell, an EEPROM cell, a flash memory cell, a latch, or a register. For some embodiments, memory cells 320 and 322 are formed using cross-coupled CMOS inverter circuits, as known in the art. The first memory cell 320 stores a first data bit "X", and the second memory cell 322 stores a second data bit "Y". Together, the two data bits X and Y can collectively represent a data value D having four possible states: "0", "1", "2", and "don't care," as depicted in the truth table 400 of FIG. 4A. According to some embodiments, the compare circuit 330 is also coupled to a set of three comparand lines CL1, CL2, and CL3. The first comparand line CL1 provides a first comparand bit "C1", the second comparand line CL2 provides a second comparand bit "C2", and the third comparand line CL3 provides a third comparand bit "C3" Together, the three comparand bits C1, C2, and C3 can collectively represent a base-3 comparand value C in binary form, as depicted in the truth table 450 of FIG. 4B.

More specifically, the logic "0", "1" and "2" states represented by the base-3 data value stored in CAM cell 300 in accordance with present embodiments correspond to the three possible digits in a base-3 numeral system. For each of these states, if the comparand data (e.g., provided to CAM cell 300 via three comparand lines CL1, CL2, and CL3) matches the data stored in CAM cell 300, the compare circuit 330 does not discharge the match line ML, which remains in its charged state to indicate a match condition. Conversely, if the comparand data does not match the data stored in CAM cell 300, compare circuit 330 discharges ML (e.g., toward ground potential) to indicate the mismatch condition. For the "don't care" state, the logic low values for X and Y cause compare circuit 330 to remain in a non-conductive state, thereby preventing the match line from discharging. In this manner, the data value D stored in CAM cell 300 is masked from the compare operation, thereby forcing a match condition for CAM cell 300, regardless of the comparand data.

The compare circuit 330 includes three match line pull-down transistors 331, 332, and 333, two relay transistors 334 and 335, and two gating transistors 336 and 337. A comparand trit provided to the CAM cell 300 is represented by three comparand bits, C1, C2, and C3, collectively. A data trit is stored in the CAM cell 300 and is represented by two data bits, X and Y, collectively. The configuration of the match line pull-down transistors, relay transistors, and gating transistors allows the compare circuit 330 to selectively discharge the match line ML in response to a comparison between the comparand bits provided on CL1, CL2, and CL3, and the data bits stored in the memory cells 320 and 322 of the CAM cell 300.

More specifically, a first NMOS match line pull down transistor 331 is coupled between the match line ML and a first node (Na), and has a gate coupled to the first comparand line CL1 to receive a first comparand bit C1 during compare operations. A first NMOS gating transistor 336 is coupled between the first node Na and ground potential, and has a gate coupled to memory cell 320 to receive the data bit X. A second NMOS match line pull down transistor 332 is coupled between the match line ML and a second node (Nb), and has a gate coupled to the second comparand line (CL2) to receive a second comparand bit C2 during compare operations. A second NMOS gating transistor 337 is coupled between the second node Nb and ground potential, and has a gate coupled to memory cell 322 to receive the data bit Y. A third NMOS match line pull down transistor 333 is coupled between the match line ML and a third node (Nc), and has a gate coupled to the third comparand line CL3 to receive a third comparand bit C3 during compare operations. A first NMOS relay transistor 334 is coupled between the first node Na and the third node Nc, and has a gate coupled to receive the complemented data bit $\overline{Y}$ the memory cell 322. A second NMOS relay transistor 335 is coupled between the second node Nb and the third node Nc, and has a gate coupled to receive the complemented data bit $\overline{X}$ from the memory cell 320. With the aforementioned configuration, the compare circuit 330 can discharge the match line ML in response to a comparison between the comparand trit and the data trit stored in the CAM cell 300, hence forming a CAM cell incorporating a base-3 numerical system.

An exemplary compare operation between a comparand trit C and a data value D stored in the CAM cell 300 is now described. During a pre-charge phase of the compare operation, the match line ML is pre-charged to logic high (e.g., towards VDD) by a suitable pre-charge circuit (not shown for simplicity), and the comparand lines CL1, CL2, and CL3 are all discharged to logic low (e.g., towards ground potential). The logic low states of CL1, CL2, and CL3 turn off respective NMOS transistors 331, 332, and 333, and thereby isolate the match line ML from ground potential.

Then, during an evaluation phase of the compare operation, the comparand trit C is provided in binary form to the CAM cell 300 as comparand bits C1, C2, and C3 via comparand lines CL1, CL2, and CL3, respectively. Pursuant to different comparand values, comparand lines CL1, CL2, and CL3 are driven to either logic high or low according to the truth table 450 of FIG. 4B. If a comparand line is driven to logic low, then a corresponding match line pull-down transistor of the compare circuit 330 is disabled. Conversely, if a comparand line is driven to logic high, then a corresponding match line pull-down transistor of the compare circuit 330 is enabled to selectively discharge the match line ML in response to the corresponding data bits provided by the associated memory cells 320 and 322. If all comparand lines CL1, CL2, and CL3 are driven to logic low (e.g., to achieve a column-masking function), then the compare circuit 330 is disabled and prevents the match line ML from discharging, thereby causing the CAM cell 300 to indicate a match condition on ML irrespective of the data value C.

Figure 4A:
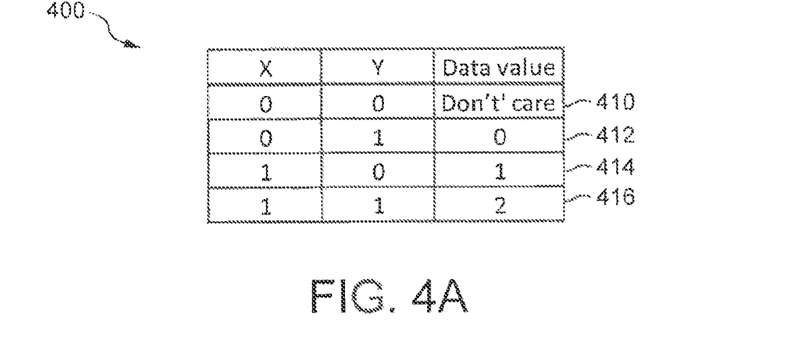
FIG. 4A shows a truth table for a CAM cell according to one embodiment.
Figure 4B:
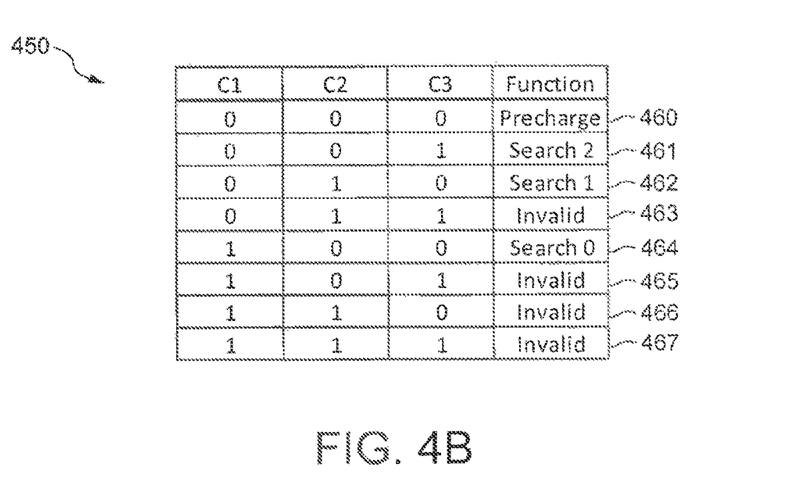
FIG. 4B is a table that illustrates how comparand bits can be provided for searching a stored base-3 digit according to one embodiment.

For one example, if the comparand value is "0" (e.g. C1=1, C2=0, and C3=0, as in row 464 of truth table 450), then CL1 is driven to logic high, and both CL2 and CL3 are driven to logic low. The logic high state of CL1 turns on match line pull down transistor 331. The logic low states of CL2 and CL3 turn off respective match line pull down transistors 332 and 333. This allows the data bits X and Y, and the complemented data bits $\overline{X}$ and $\overline{Y}$, to selectively discharge the match line ML according to the comparand data. Thus, if the data value is "0" (e.g., X=0, X=1, Y=1, and $\overline{Y}$=0, as in row 412 of truth table 400), the logic low state of X turns off gating transistor 336, and isolates node Na from ground potential. The gating transistor 337 and relay transistor 335 are turned on by the logic high states of Y and $\overline{X}$, respectively, and therefore pull nodes Nb and Nc to ground potential. The logic low state of $\overline{Y}$ turns off the relay transistor 334, and isolates node Na (and hence the match line ML) from ground potential. As a result, the match line ML remains in its charged state to indicate the match condition between comparand value=0 and data value=0.

Conversely, if the data value is "1" (e.g., X=1, $\overline{X}$=0, Y=0, and $\overline{Y}$=1, as in row 414 of truth table 400), the logic high state of X turns on gating transistor 336, which in turn discharges the match line ML low toward ground potential to indicate the mismatch condition between comparand value=0 and data value=1. The logic high state of Y turns on relay transistor 334, which pulls node Nc low toward ground potential via gating transistor 336. The relay transistor 335 and gating transistor 337 are turned off by the logic low states of $\overline{X}$ and Y, respectively, Node Nb is therefore isolated from ground potential and does not affect the compare operation.

By the same principle, if the data value is "2" (e.g., X=1, $\overline{X}$=0, Y=1, and $\overline{Y}$=0, as in row 416 of truth table 400), the logic high state of X turns on gating transistor 336 and discharges the match line ML low toward ground potential to indicate the mismatch condition between comparand value=0 and data value=2. The logic high state of Y turns on gating transistor 337, which pulls node Nb low toward ground potential. However, the relay transistor 335 and relay transistor 334 are turned off by the logic low states of $\overline{X}$ and $\overline{Y}$, respectively. Node Nc is therefore isolated from ground potential and does not affect the compare operation.

The CAM cell 300 operates in a similar manner for compare operations in which the comparand value is "1" (e.g., C1=0, C2=1, and C3=0, as in row 462 of truth table 450), where CL2 is driven to logic high, and both CL1 and CL3 are driven to logic low. More specifically, the logic high state of CL2 turns on match line pull down transistor 332. The logic low states of CL1 and CL3 turn off respective match line pull down transistors 331 and 333. This allows the data bits X and Y, and the complemented data bits $\overline{X}$ and $\overline{Y}$, to selectively discharge the match line ML according to the comparand data. Thus, if the data value is "1" (e.g., X=1, $\overline{X}$=0, Y=0, and $\overline{Y}$=1, as in row 414 of truth table 400), the logic low state of Y turns off gating transistor 337, and isolates the node Nb from ground potential. The gating transistor 336 and relay transistor 334 are turned on by the logic high states of X and $\overline{Y}$, respectively, and therefore pull nodes Na and Nc to ground potential. The logic low state of $\overline{X}$ off the relay transistor 335, and isolates node Nb (and hence the match line ML) from ground potential. As a result, the match line ML remains in its charged state to indicate the match condition between comparand value=1 and data value=1.

Conversely, if the data value is "0" (e.g., X=0, $\overline{X}$=1, Y=1, and $\overline{Y}$=0, as in row 412 of truth table 400), the logic high state of Y turns on gating transistor 337 and discharges the match line ML low toward ground potential to indicate the mismatch condition between comparand value=1 and data value=0. The logic high state of $\overline{X}$ turns on relay transistor 335, and the logic state of node Nc is pulled low toward ground potential via gating transistor 337. The relay transistor 334 and gating transistor 336 are turned off by the logic low states of $\overline{Y}$ and X, respectively. Node Na is therefore isolated from ground potential and does not affect the compare operation.

By the same principle, if the data value is "2" (e.g., X=1, $\overline{X}$=0, Y=1, and $\overline{Y}$=0, as in row 416 of truth table 400), the logic high state of Y turns on gating transistor 337 and discharges the match line ML low toward ground potential to indicate the mismatch condition between comparand value=1 and data value=2. The logic high state of X turns on gating transistor 336, Which pulls node Na low toward ground potential. The relay transistors 335 and 334 are turned off by the logic low states of $\overline{X}$ and $\overline{Y}$, respectively. Node Nc is therefore isolated from ground potential and does not affect the compare operation.

Again, the CAM cell 300 operates in a similar manner for compare operations in which the comparand value is "2" (e.g. C1=0, C2=0, and C3=1, as in row 461 of truth table 450), where CL3 is driven to logic high, and both CL1 and CL2 are driven to logic low, More specifically, the logic high state of CL3 turns on match line pull down transistor 333. The logic low states of CL1 and CL2 turn off respective match line pull down transistors 331 and 332. This allows the data bits X and Y, and the complemented data bits X and Y, to selectively discharge the match line ML according to the comparand data. Thus, if the data value is "2" (e.g., X=1, $\overline{X}$=0, Y=1, and $\overline{Y}$=0, as in row 416 of truth table 400), the logic low state of $\overline{X}$ turns off relay transistor 335, and isolates the node Nc (and hence the match line ML) from node Nb. The logic low state of $\overline{Y}$ turns off the relay transistor 334, and isolates the node Nc (and hence the match line ML) from node Na. The two gating transistors 336 and 337 are turned on by the logic high states of X and Y, respectively, and therefore pull nodes Na and Nb low to ground potential. However, since node Nc is isolated from nodes Na and Nb, Nc is also isolated from ground potential. As a result, the match line ML remains in its charged state to indicate the match condition between comparand value=2 and data value=2.

Conversely, if the data value is "0" (e.g., X=0, Y=1, and Y=0, as in row 412 of truth table 400), the logic high states of Y and $\overline{X}$ turn on gating transistor 337 and relay transistor 335, respectively, which together discharge the match line ML low toward ground potential to indicate the mismatch condition between comparand value=2 and data value=0. The relay transistor 334 and gating transistor 336 are turned off by the logic low states of Y and X, respectively. Node Na is therefore isolated from ground potential and does not affect the compare operation.

By the same principle, if the data value is "1" (e.g., X=1, $\overline{X}$=0, Y=0, and $\overline{Y}$=1, as in row 414 of truth table 400), the logic high states of X and $\overline{Y}$ turn on gating transistor 336 and relay transistor 334, respectively, which together discharge the match line ML low toward ground potential to indicate the mismatch condition between comparand value=2 and data value=1. The relay transistor 335 and gating transistor 337 are turned off by the logic low states of $\overline{X}$ and Y, respectively. Node Nb is therefore isolated from ground potential and does not affect the compare operation.

When the CAM cell 300 stores a "don't care" value (e.g., X=0, $\overline{X}$=1, Y=0, and $\overline{Y}$=1, as in row 410 of truth table 400), the memory cells 320 and 322 both store a "0". The logic low states of X and Y turn off gating transistors 336 and 337, respectively, and thus isolate the match line ML from ground potential. Therefore, regardless of comparand value, the match line ML is forced to indicate a match.

In accordance with the present embodiments, the compare circuit 330 of the CAM cell 300 includes seven transistors (e.g., transistors 331-337) and three comparand lines (e.g., CL1-CL3). In contrast, the conventional CAM cell 100 includes four transistors (e.g., 131-134) and two comparand lines (e.g., CL/CLB). With three extra transistors and one extra comparand line, the present embodiments can increase the data storage density of an XY CAM cell by fully utilizing all four possible states. Specifically, present embodiments incorporate a base-3 numerical system to enable the same number of XY CAM cells to represent a greater number of data values, as compared to the conventional approach illustrated in FIG. 1A and FIG. 1B. Further, because of the increased data storage density, less CAM cells are needed in a CAM device, and therefore present embodiments may reduce power consumption, as compared with conventional CAM cell 100.

It is noted that the above discussion of data value assignment in FIG. 4A and the use of comparand trits in binary form in FIG. 4B together with the compare circuit 330 is illustrative and not limiting. Indeed, the present embodiments can include a different data value assignment and/or a different compare circuit that, when combined, achieve similar logic functions. It is further noted that a CAM device employing CAM cells in accordance with present embodiments may also need to either incorporate a base-3 numerical system or include a numerical converter circuit to convert the data value D and the comparand value C into base-3 format. In one embodiment, the numerical converter circuit may include an enable signal to select either a base-3 numerical system or a conventional binary numerical system. However, if a conventional binary numerical system is to be used in CAM cells configured in accordance with present embodiments, corresponding masks are generated in order to maintain the correctness of the compare results.

Further, the CAM cell 300 of FIG. 3 can be selectively configured to operate as a base-2 XY CAM cell (e.g., to compare base-2 binary comparand data with base-2 binary data values stored therein) by setting comparand line C3 to logic low so that the third comparand bit C3 is maintained in the logic "0" state. The logic low state of C3 maintains match line pull-down transistor 333 in a non-conductive state, thereby isolating node Nc from the match line ML. In this manner, a base-2 comparand value represented by complementary comparand bits C1 and C2 can be compared with a base-2 data value represented by the X and Y bits stored in respective memory cells 320 and 322 by compare circuit 330. More specifically, when CAM cell 300 stores complementary X and Y bits representative of either a logic 0 or logic 1 value for D, one of the $\overline{X}$ and $\overline{Y}$ bits will be logic low and therefore will turn off a corresponding one of relay transistors 334-335, thereby isolating nodes Na and Nb from each other (e.g., so that the match line pull-down paths formed by transistors 331/336 and transistors 332/337 operate independently). When CAM cell 300 stores a don't care or mask value represented by X=Y=0, the corresponding logic high states of $\overline{X}$ and $\overline{Y}$ will turn on relay transistors 334 and 335 to couple node Na and Nb together, and the logic low states of X and Y maintain respective pull-down transistors 336 and 337 in non-conductive states to prevent the match line ML from discharging.

Figure 5A:
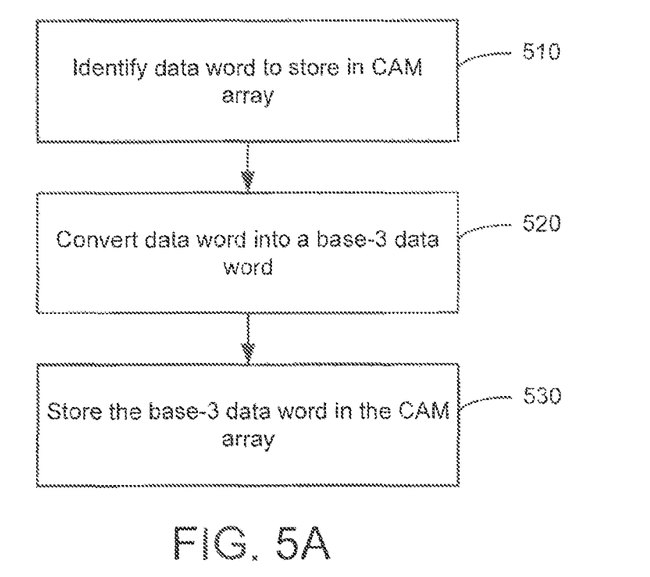
FIG. 5A is a flowchart illustrating storage of a base-3 data word in a CAM array according to some embodiments.

FIG. 5A is a flowchart illustrating the creation and storage of a data word by a numerical converter circuit in a CAM array according to an embodiment. First, a data word (e.g., a binary value) to be stored in the CAM array is identified (510). Next, a numerical converter circuit converts the data word using a predetermined truth table, one similar to truth table 400 of FIG. 4A, to generate a base-3 data word (520). Then, the base-3 data word may be stored in each CAM cell 300 of the CAM array (530). Since each of the base-3 CAM cells according to present embodiments may store a trit, the number of base-3 CAM cells required to store the base-3 data word may be less than the number of conventional CAM cells required to store the original binary data word.

Figure 5B:
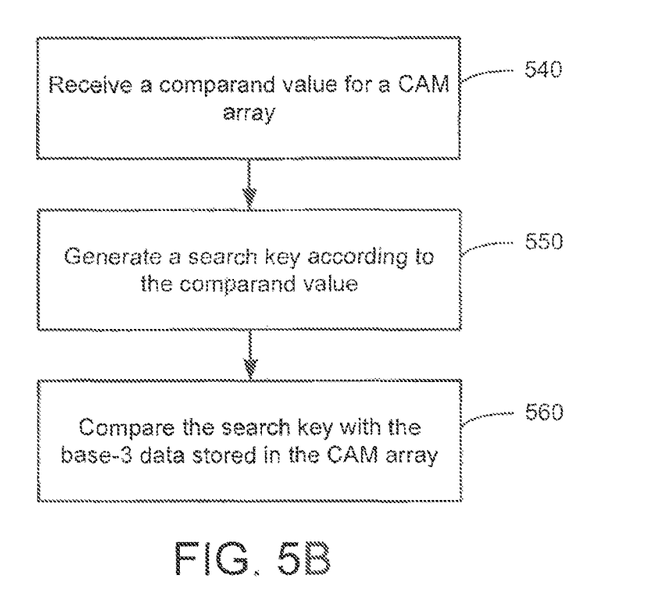
FIG. 5B is a flowchart illustrating a comparison between a comparand value and a base-3 data word stored in a CAM array according to some embodiments.

FIG. 5B is a flowchart illustrating the creation and assertion of a comparand value in a CAM array according to an embodiment. First, a comparand value (e.g., a binary value) for the CAM array is received (540). Next, a search key corresponding to the comparand value is generated according to another predetermined truth table, one similar to truth table 450 of FIG. 4B (550). In some embodiments, the binary comparand value may be first converted into a base-3 comparand value using the numerical converter circuit and then be used to generate the search key. In other embodiments, the search key may be generated directly from the binary comparand value using, for example, a well-known hash table. Thereafter, the search key is asserted on the comparand lines during the compare operation, and is compared with the base-3 data stored in the CAM array by the compare circuits (560) to generate match results.

While the numerical converter circuit has chiefly been described as being configured to always store, within each CAM cell of each CAM array, a single trit of a base-3 data word, in other embodiments, the numerical converter circuit may be implemented such that the numerical converter circuit may selectively store a trit of a base-3 data word or a bit of a binary data word within each CAM cell of a CAM array.

While particular embodiments have been shown and described it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

What is claimed is:

1. A content addressable memory (CAM) device including a CAM array having a plurality of quaternary CAM cells each configured to store a base-3 data value having one of four possible states represented by first and second data bits, wherein a respective CAM cell comprises:
   first and second memory cells for storing the first and second data bits, respectively; and
   a compare circuit, coupled to the first and second memory cells and to a match line, to selectively discharge the match line in response to a compare operation between a base-3 comparand value and the base-3 data value;
   wherein the CAM array is configured to selectively store a trit of a base-3 data word or a bit of a binary data word within each CAM cell of the CAM array.

2. The CAM device of claim 1, further comprising a first circuit coupled to the match line, and configured to pre-charge the match line during a pre-charge phase of the compare operation.

3. The CAM device of claim 1, further comprising a first circuit coupled to the match line, and configured to pre-charge the match line to a logic high during a pre-charge phase of the compare operation.

4. The CAM device of claim 1, wherein the compare circuit comprises three pull-down transistors, each configured to selectively discharge the match line.

5. The CAM device of claim 1, wherein the four possible states consist of a logic 0 value, a logic 1 value, a logic 2 value, and a don't care state.

6. The CAM device of claim 1, wherein the compare circuit comprises:
 a first pull-down transistor connected between the match line and a first node, and having a gate configured to receive a first comparand bit;
 a second pull-down transistor connected between the match line and a second node, and having a gate configured to receive a second comparand bit; and
 a third pull-down transistor connected between the match line and a third node, and having a gate configured to receive a third comparand bit.

7. The CAM device of claim 6, wherein the compare circuit further comprises:
 a first relay transistor connected between the first node and the third node, and having a gate configured to receive a complemented second data bit; and
 a second relay transistor connected between the second node and the third node, and having a gate configured to receive a complemented first data bit.

8. The CAM device of claim 7, wherein the compare circuit further comprises:
 a first gating transistor connected between the first node and ground potential, and having a gate configured to receive the first data bit; and
 a second gating transistor connected between the second node and ground potential, and having, a gate configured to receive the second data bit.

9. The CAM device of claim 8, wherein the first, second, and third pull-down transistors are each an NMOS transistor, the first and second relay transistors are each an NMOS transistor, and the first and second gating transistors are each an NMOS transistor.

10. A content addressable memory (CAM) cell configured to store a base-3 data value having one of four possible states represented by first and second data bits, wherein the CAM cell comprises:
 first and second memory cells configured to store the first and second data bits, respectively; and
 a compare circuit configured to compare a base-3 comparand value with the base-3 data value, and further configured to change a logic state of a match line, wherein the base-3 comparand value is provided to the CAM cell as three comparand bits.

11. The CAM cell of claim 10, wherein the compare circuit is configured to change the logic state of the match line by discharging the match line.

12. The CAM cell of claim 10, wherein the compare circuit is configured to change the logic state of the match line by discharging the match line after the match line has been pre-charged.

13. The CAM cell of claim 10, wherein the compare circuit is configured to change the logic state of the match line by discharging the match line after the match line has been pre-charged to a logic high.

14. The CAM cell of claim 10, wherein the compare circuit is configured to compare the three comparand bits with the first and second data bits at the same time.

15. The CAM cell of claim 10, wherein the four possible states consist of a logic 0 value, a logic 1 value, a logic 2 value, and a don't care state.

16. The CAM cell of claim 10, wherein the compare circuit comprises three pull-down transistors, each configured to selectively discharge the match line in response to a corresponding one of the three comparand bits.

17. The CAM cell of claim 10, wherein the compare circuit comprises:
 a first pull-down transistor connected between the match line and a first node, and having a gate configured to receive a first comparand bit;
 a second pull-down transistor connected between the match line and a second node, and having a gate configured to receive a second comparand bit; and
 a third pull-down transistor connected between the match line and a third node, and having a gate configured to receive a third comparand bit.

18. The CAM cell of claim 17, wherein the compare circuit further comprises:
 a first relay transistor connected between the first node and the third node, and having a gate configured to receive a complemented second data bit; and
 a second relay transistor connected between the second node and the third node, and having a gate configured to receive a complemented first data bit.

19. The CAM cell of claim 17, wherein the compare circuit further comprises:
 a first gating transistor connected between the first node and ground potential, and having a gate configured to receive the first data bit; and
 a second gating transistor connected between the second node and ground potential, and having a gate configured to receive the second data bit.

* * * * *